United States Patent [19]

Migita

[11] Patent Number: 5,130,271

[45] Date of Patent: Jul. 14, 1992

[54] METHOD OF MANUFACTURING A SEMICONDUCTOR DEVICE HAVING NO STEP AT THE BOUNDARY BETWEEN SELF ALIGNED P- OR N- TYPE IMPURITY REGIONS

[75] Inventor: Takahisa Migita, Tokyo, Japan

[73] Assignee: NEC Corporation, Tokyo, Japan

[21] Appl. No.: 594,304

[22] Filed: Oct. 9, 1990

[30] Foreign Application Priority Data

Oct. 16, 1989 [JP] Japan ................... 1-269644

[51] Int. Cl.$^5$ ................... H01L 21/302; H01L 21/76
[52] U.S. Cl. ................... 437/147; 437/70;
  437/984; 148/DIG. 70
[58] Field of Search ................... 437/34, 147, 57, 70,
  437/984; 148/DIG. 82, DIG. 70

[56] References Cited

U.S. PATENT DOCUMENTS

| | | | |
|---|---|---|---|
| 4,558,508 | 12/1985 | Kinney et al. | 437/34 |
| 4,584,027 | 4/1986 | Metz, Jr. | 148/DIG. 82 |
| 4,600,445 | 7/1986 | Horr et al. | 437/57 |
| 4,956,306 | 9/1990 | Fuller et al. | 437/34 |

OTHER PUBLICATIONS

Ghandhi, S. K., VLSI Fabrication Principles, pp. 542-550, 1983.

Primary Examiner—Brian E. Hearn
Assistant Examiner—C. Chaudhari
Attorney, Agent, or Firm—Laff, Whitesel, Conte & Saret

[57] ABSTRACT

A method of manufacturing a semiconductor device includes the steps of forming an insulating film on a semiconductor substrate, selectively removing the insulating film to expose a surface of the semiconductor substrate, doping an impurity in the semiconductor substrate using the selectively formed insulating film as a mask, thereby forming an impurity region of one conductivity type, forming a photoresist film on the entire surface of the semiconductor substrate in an area including the insulating film used as the mask, selectively removing only the photoresist film on the insulating film to leave the photoresist film on only the impurity region of one conductivity type, removing the insulating film at a portion from which the photoresist film is removed, thereby exposing the surface of the semiconductor substrate, and doping an impurity using a remaining photoresist as a mask to form an impurity region of the other conductivity type in the exposed surface of the semiconductor substrate.

2 Claims, 3 Drawing Sheets

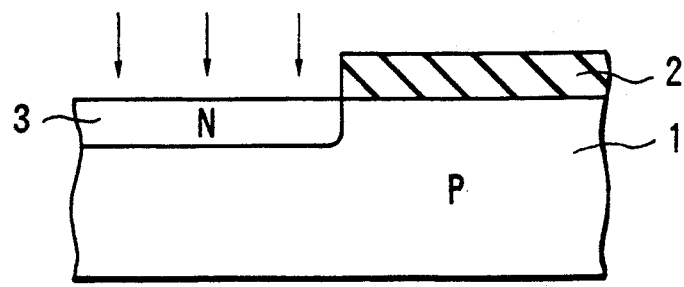
F I G. 1A
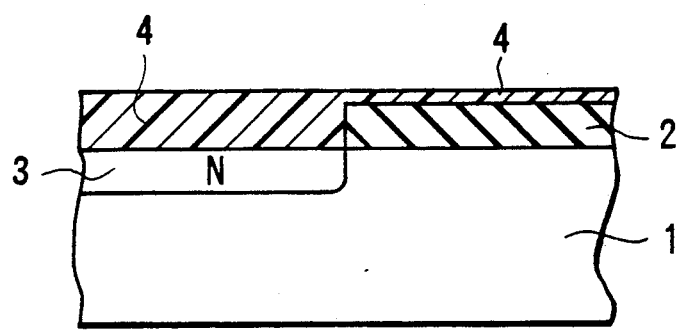
F I G. 1B
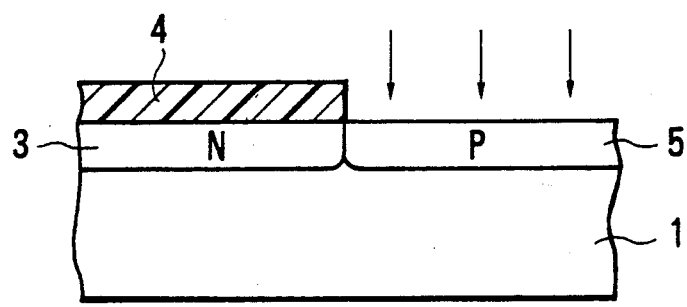
F I G. 1C
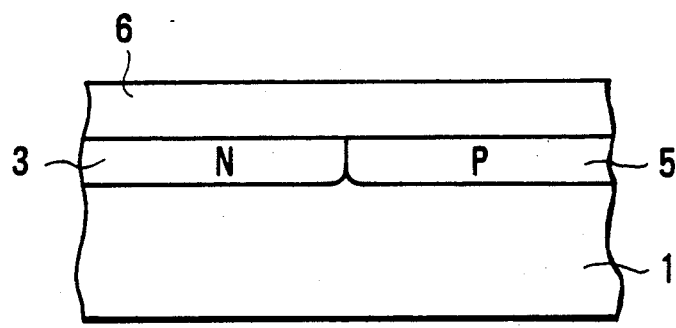
F I G. 1D

METHOD OF MANUFACTURING A SEMICONDUCTOR DEVICE HAVING NO STEP AT THE BOUNDARY BETWEEN SELF ALIGNED P- OR N- TYPE IMPURITY REGIONS

BACKGROUND OF THE INVENTION

The present invention relates to a method of manufacturing a semiconductor device and, more particularly, to a method of manufacturing a semiconductor device having an impurity region of one conductivity type and an impurity region of the other conductivity type which are self-aligned on a semiconductor substrate.

A method of forming p- and n-type impurity regions using a conventional self-alignment technique will be exemplified as formation of a buried region and an epitaxial layer formed in a subsequent step with reference to FIGS. 3A to 3D.

As shown in FIG. 3A, a thin oxide film 2B is formed on a semiconductor substrate 1 by thermal oxidation. An anti-oxidation film such as a nitride film 7A is formed on the oxide film 2B by an epitaxial growth method or the like.

As shown in FIG. 3B, a photoresist (not shown) is applied to the nitride film 7A and is patterned using a photoetching method. The nitride film 7A or the oxide film 2B is etched using the resultant resist pattern as a mask. After the resist pattern is removed, arsenic ions having a high concentration are selectively implanted in the resultant structure using the nitride film 7A as a mask, thereby forming an n-type impurity region 3.

As shown in FIG. 3C, in order to form a self-aligned p-type impurity region, the resultant structure is selectively oxidized using the nitride film 7A as a mask to form a thick oxide film 2C on the n-type impurity region 3. The nitride film 7A or the oxide film 2B is removed, and boron or the like is doped using the thick oxide film 2C as a mask to form a p-type impurity region 5.

Finally, as shown in FIG. 3D, the oxide films 2C and 2D on the semiconductor substrate 1 are entirely removed by etching or the like, and then an epitaxial film 6 is formed on the entire surface of the semiconductor substrate 1.

In the step of forming an impurity region in the conventional method of manufacturing the semiconductor device, as described above, when the p-type impurity region 5 is to be selectively formed, selective oxidation is performed using the patterned nitride film 7A as a mask. The thick oxide film 2C is formed, and the nitride film 7A is removed. Finally, the p-type impurity region 5 is formed using the thick oxide film 2C as a mask. For this reason, when the thick oxide film is removed from the semiconductor substrate 1, a step is formed in a boundary between the p- and n-type impurity regions 5 and 3, as shown in FIG. 3D. In addition, even if epitaxial growth is performed on the entire surface of the substrate, the step is left on the surface of the epitaxial film 6. In a subsequent step, when the surface layer of the epitaxial film 6 for isolating an element region is selectively thermally oxidized to form an element isolation oxide film 8, stress is concentrated on the step of the epitaxial film 6 at the boundary between the p- and n-type impurity regions to cause crystal defects. As a result, an error occurs in the resultant semiconductor device.

SUMMARY OF THE INVENTION

It is an object of the present invention to solve the conventional problems described above and to provide a method of manufacturing a semiconductor device, which allows formation of self-aligned p- and n-type impurity regions in a simple manufacturing process and growing of a flat epitaxial film having no step at a boundary between the impurity regions.

In order to achieve the above object of the present invention, there is provided a method of manufacturing a semiconductor device including the steps of forming an insulating film on a semiconductor substrate, selectively removing the insulating film to expose a surface of the semiconductor substrate, doping an impurity in the semiconductor substrate using the selectively formed insulating film as a mask, thereby forming an impurity region of one conductivity type, forming a photoresist film on an entire surface of the semiconductor substrate in an area including the insulating film used as the mask, selectively removing only the photoresist film on the insulating film to leave the photoresist film on only the impurity region of one conductivity type, removing the insulating film at a portion from which the photoresist film is removed, thereby exposing the surface of the semiconductor substrate, and doping an impurity using a remaining photoresist as a mask to form an impurity region of the other conductivity type in the exposed surface of the semiconductor substrate.

BRIEF DESCRIPTION OF THE DRAWINGS

FIGS. 1A to 1D and FIGS. 2A to 2D are sectional views of semiconductor chips for explaining the first and second embodiments of the present inventions, respectively.

DESCRIPTION OF THE PREFERRED EMBODIMENTS

Figure 2A:
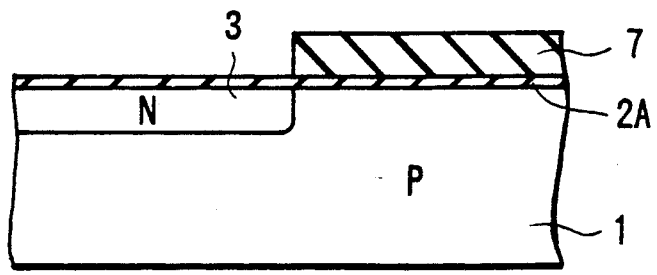

Preferred embodiments of the present invention will be described in detail below with reference to the accompanying drawings.

FIGS. 1A to 1D are sectional views of a semiconductor chip for explaining the steps in manufacturing a semiconductor device according to the first embodiment of the present invention.

As shown in FIG. 1A, a thick silicon oxide film 2 having a thickness of 1 $\mu$m or more is entirely formed on a p-type semiconductor (e.g., silicon) substrate 1 by thermal oxidation. A photoresist (not shown) is applied to the oxide film 2 and is patterned by a known photoetching method. The oxide film 2 is anisotropically etched using this photoresist pattern as a mask to expose the surface of the semiconductor substrate. After the photoresist film is removed, arsenic ions having a high concentration are selectively implanted using the patterned oxide film 2 as a mask, thereby forming an n-type impurity region 3.

As shown in FIG. 1B, a photoresist film 4 is formed on the surface of the semiconductor substrate 1 by a coating method to cover the entire surface of the semiconductor substrate 1.

As shown in FIG. 1C, the photoresist film 4 on the oxide film 2 is selectively removed by anisotropic etching. The oxide film 2 is etched using the remaining photoresist film 4 having a thickness of 0.8 $\mu$m or more as a mask to expose the surface of the semiconductor substrate 1. Subsequently, boron ions are implanted using, as a mask, the photoresist film 4 formed on the n-type impurity region 3, thereby forming a p-type impurity region 5.

As shown in FIG. 1D, the photoresist film 4 is removed to expose the entire surface of the semiconductor substrate 1, and then an epitaxial silicon film 6 is grown.

According to the first embodiment, since a surface step is not formed at a boundary between the p-and n-type impurity regions, the flat epitaxial film 6 can be formed.

FIGS. 2A to 2D are sectional views of a semiconductor chip for explaining the steps in manufacturing a semiconductor device according to the second embodiment of the present invention.

As shown in FIG. 2A, a thin oxide film 2A is formed on a p-type semiconductor substrate 1 by thermal oxidation, and a nitride film 7 having a thickness of 1 μm or more is grown on the oxide film 2A by a chemical vapor deposition method or the like. A photoresist film (not shown) is formed on the entire surface of the resultant structure as in the first embodiment, and a resist pattern is formed by a photoetching method. Only the nitride film 7 is selectively etched using this photoresist pattern as a mask. The photoresist film is removed, and an n-type impurity region 3 having a high concentration is selectively formed in the semiconductor substrate by using the nitride film 7 as a mask. In this case, arsenic ions may be implanted through the thin oxide film 2A.

Figure 2B:
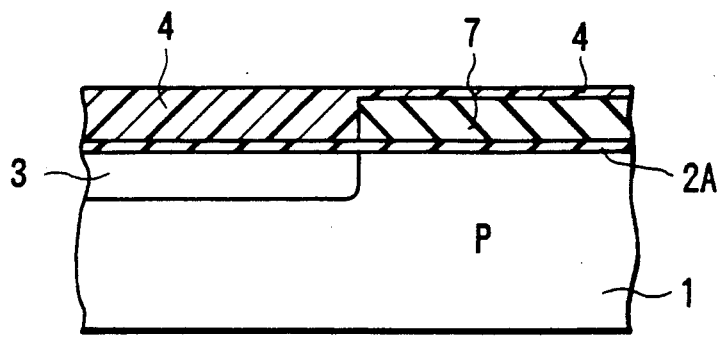

As shown in FIG. 2B, a photoresist film 4 is coated to cover the entire surface of the resultant structure.

Figure 2C:
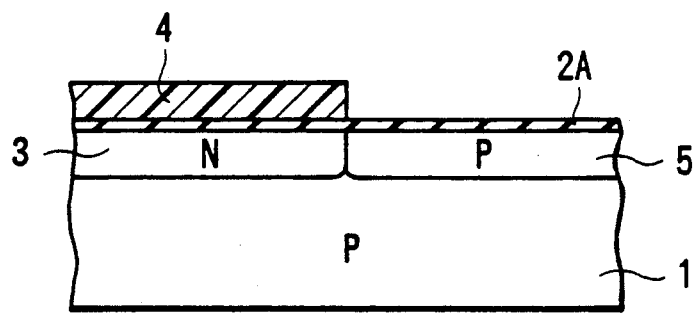

As shown in FIG. 2C, a self-aligned photoresist film 4 is formed on only an n-type impurity region 3 following the same procedures as in the first embodiment, and only the nitride film 7 is selectively removed. Boron ions are implanted in the semiconductor substrate 1 through the oxide film 2A by using the photoresist film 4 as a mask, thereby selectively forming a p-type impurity region 5 having a high concentration.

Figure 2D:
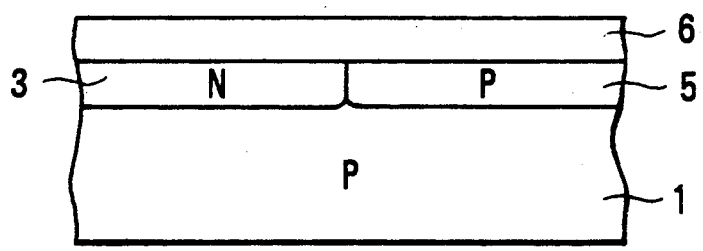
Figure 3A:
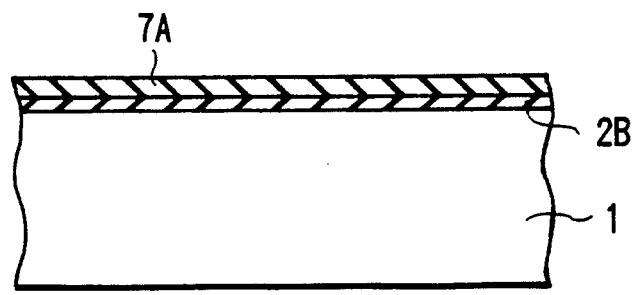
FIGS. 3A to 3D are sectional views of a semiconductor chip for explaining a conventional example.
Figure 3B:
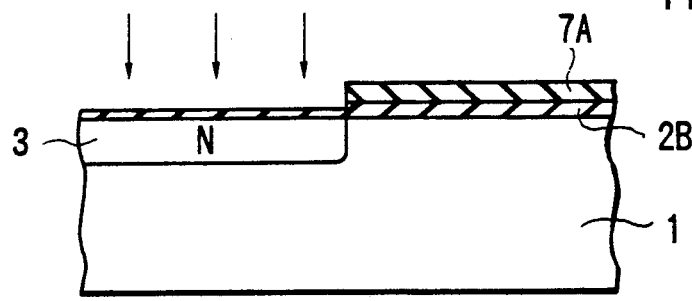
Figure 3C:
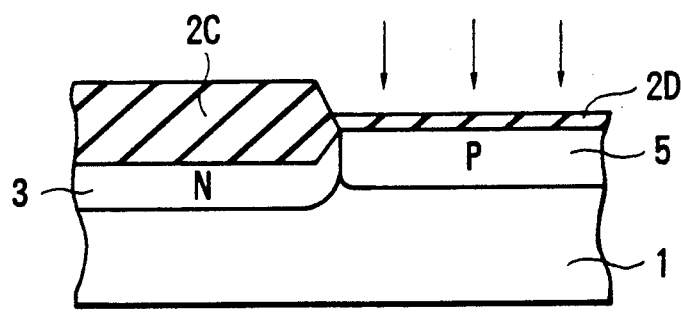
Figure 3D:
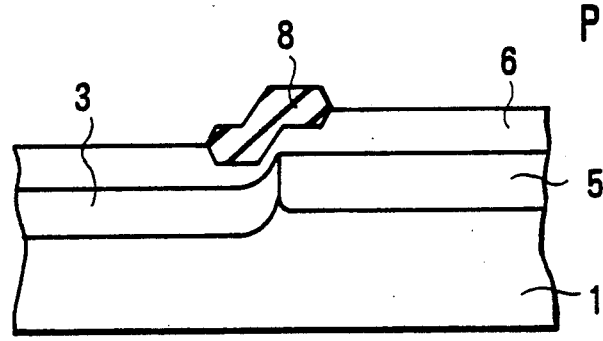

As shown in FIG. 2D, the photoresist film 4 and the oxide film 2A are entirely removed, and an epitaxial film 6 is formed.

In the second embodiment, an impurity is ion-implanted through the thin oxide film 2A to grow the p- and n-type impurity regions. Therefore, formation of crystal defects in the semiconductor substrate is minimized.

Each of the embodiments described above exemplifies anisotropic etching in leaving the photoresist film 4 in the n-type impurity region. However, isotopic etching or exposure method may be used in place of anisotropic etching.

According to the present invention, as has been described above, in the step of forming an impurity region of one conductivity type and an impurity region of the other conductivity type in a self-aligned manner, the patterned insulating film on the semiconductor substrate is used as a mask to form the impurity region of one conductivity type. Subsequently, a photoresist film formed on only this impurity region of one conductivity type is used as a mask to form the self-aligned impurity region of the other conductivity type, thereby substantially eliminating a step at a boundary between the impurity regions. When a thick oxide film for element isolation is to be formed after an epitaxial film is formed on the resultant structure, crystal defects caused by stress concentration can be prevented because the step is eliminated from the boundary between the impurity regions in a conventional structure. Therefore, a semiconductor device having improved reliability and an increased yield can be obtained.

What is claimed is:

1. A method of manufacturing a semiconductor device, comprising the steps of:
   forming an insulating film on a semiconductor substrate;
   selectively removing at least some of said insulating film to expose a surface of said semiconductor substrate;
   doping an impurity in said semiconductor substrate using the selectively formed insulating film as a mask, thereby forming an impurity region of one conductivity type;
   forming a photoresist film on entire surfaces of said semiconductor substrate and said insulating film;
   removing the upper part of said photoresist film by anisotropically etching until the upper surface of said insulating film used as a mask is exposed to leave the photoresist film on only said impurity region of one conductivity type;
   removing said insulating film, thereby exposing the surface of said semiconductor substrate; and
   doping an impurity using a remaining photoresist as a mask to form an impurity region of the other conductivity type in the exposed surface of said semiconductor substrate.

2. A method according to claim 1, wherein said insulating film is an oxide film.

* * * * *